United States Patent [19]
Kurihara

[11] Patent Number: 5,128,998
[45] Date of Patent: Jul. 7, 1992

[54] HEAD OR ARBITRARY BIT PULSE GENERATING CIRCUIT AND SAMPLING PULSE GENERATING CIRCUIT IN A PSEUDO NOISE CODE GENERATOR

[75] Inventor: Takao Kurihara, Tokyo, Japan

[73] Assignee: Clarion Co., Ltd., Tokyo, Japan

[21] Appl. No.: 585,911

[22] Filed: Sep. 21, 1990

[30] Foreign Application Priority Data

Sep. 28, 1989 [JP] Japan .................. 1-252955

[51] Int. Cl.⁵ .................................. G06F 1/02
[52] U.S. Cl. ........................ 380/46; 364/717; 375/1
[58] Field of Search ............. 331/78; 380/46, 34; 375/1; 364/717

[56] References Cited

U.S. PATENT DOCUMENTS

| | | | |
|---|---|---|---|
| 4,516,217 | 5/1985 | Starner | 364/717 |
| 4,571,546 | 2/1986 | Wilkinson | 331/78 X |
| 4,845,726 | 7/1989 | Kurihara et al. | 377/33 |
| 4,864,525 | 9/1989 | Kurihara et al. | 364/717 |
| 4,943,975 | 7/1990 | Kurihara et al. | 375/1 |

*Primary Examiner*—Bernarr E. Gregory
*Attorney, Agent, or Firm*—Flynn, Thiel, Boutell & Tanis

[57] ABSTRACT

A pseudo noise code generator is disclosed, in which the shift register value of the pseudo noise code generator corresponding to the generation timing of a bit pulse or a sampling pulse is latched and the output of the latch is compared with the shift register value of the generator, the bit pulse or the sampling pulse being obtained, when they are in accordance with each other.

5 Claims, 8 Drawing Sheets

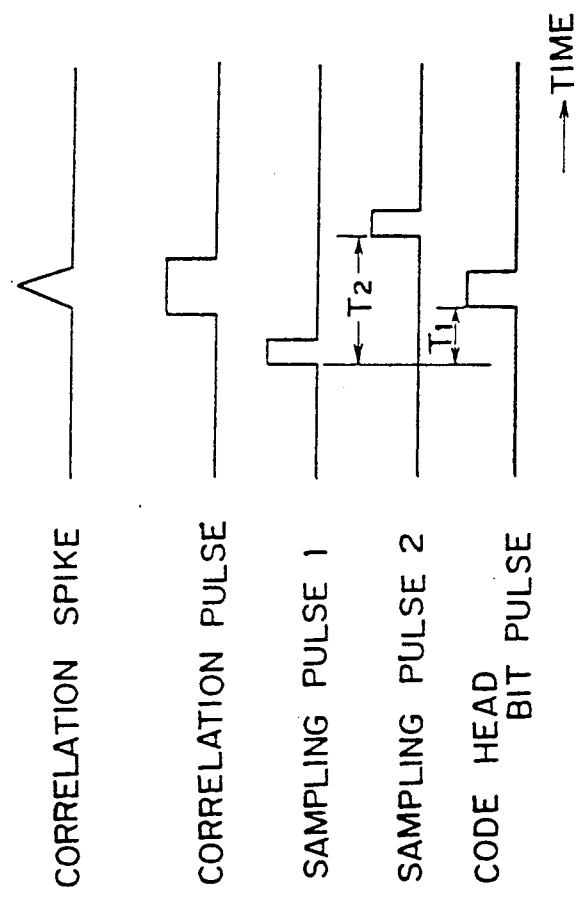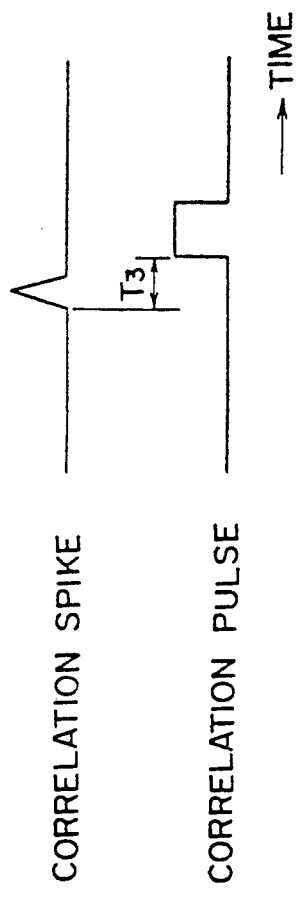

HEAD OR ARBITRARY BIT PULSE GENERATING CIRCUIT AND SAMPLING PULSE GENERATING CIRCUIT IN A PSEUDO NOISE CODE GENERATOR

FIELD OF THE INVENTION

The present invention relates to a pseudo noise generator and in particular to an improvement of a head or arbitrary bit pulse generating circuit or a sampling pulse generating circuit used therein.

BACKGROUND OF THE INVENTION

Heretofore, as disclosed e.g. JP-P-1-98340A, corresponding to U.S. Pat. No. 4,943,975, in a direct spread spectrum communication system using a correlator such as a surface acoustic wave (SAW) convolver, in the case where a pseudo noise code (hereinbelow abbreviated to PN code) is used as spreading code, it is necessary to use a code synchronizing system in the receiver.

A pseudo noise code generator (hereinbelow abbreviated to PNG) used in the system described above is a device as disclosed, corresponding to U.S. Pat. No. 4,845,726, in JP-P-63-18836A and the synchronizing system using such a PNG has drawbacks as indicated in following items (1) to (3).

(1) In order to generate a head bit pulse of a PN code outputted by a PNG 1, as indicated in FIG. 2, a high speed counter is necessary for the counter 2, which counts the PN code length.

(2) In order to generate sampling pulses sampling correlation pulses from correlation spikes outputted by an SAW convolver, which are used in a digital phase lock loop (DPLL) for holding the synchronization, apart from a counter 3, a high speed shift register is necessary as the shift register, as indicated in FIG. 4.

(3) A counter and a shift register, which are high speed circuits, as indicated in (1) and (2), have a drawback that the number of elements and electric power consumption are increased, e.g. when they are formed in an IC.

OBJECT OF THE INVENTION

Consequently the object of the present invention is to provide a head or arbitrary bit pulse generating circuit and a sampling pulse generating circuit for the PN code in a pseudo noise code generator suitable for the code synchronizing system in a spread spectrum receiver, etc. without using any high speed counter or shift register.

SUMMARY OF THE INVENTION

In order to achieve the above object, a head or arbitrary bit pulse generating circuit in a PNG according to the first invention is characterized in that it comprises a latch circuit, which latches a shift register value of a PNG corresponding to the timing of bit pulse generation; and a comparing circuit, which compares the shift register translation value of the PNG with the output of the latch circuit and outputs a bit pulse, depending on the result of the comparison.

Further a sampling pulse generating circuit in a PNG according to a second invention is characterized in that it comprises a latch circuit, which latches a shift register value of a PNG corresponding to the timing of bit pulse generation; and a comparing circuit, which compares the shift register transition value of the PNG with the output of the latch circuit and outputs a sampling pulse, depending on the result of the comparison The bit pulse or the sampling pulse is obtained, when the latch output of the shift register value of the PNG corresponding to the generation timing of the bit pulse or the sampling pulse and the transition value of the shift register are in accordance with each other. Consequently it is not necessary to use any high speed counter or shift register.

BRIEF DESCRIPTION OF THE DRAWINGS

FIGS. 6A and 6B are schemes for explaining the sampling pulse and the correlation pulse;

DETAILED DESCRIPTION

Figure 1:
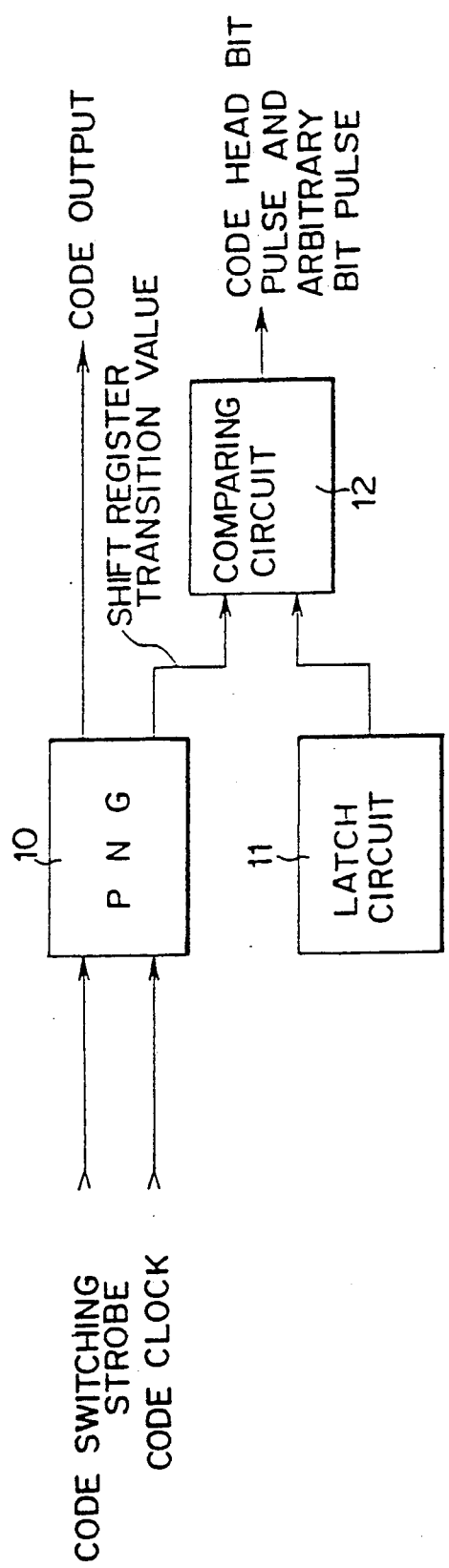
FIG. 1 is a block diagram showing an embodiment of the first invention.

Hereinbelow the present inventions will be explained, referring to the embodiments indicated in the drawing. FIG. 1 indicates an embodiment of a circuit generating the head bit pulse or the arbitrary bit pulse of the PN code according to the first invention, in which the reference numeral 10 is a PNG; 11 is a latch circuit; and 12 is a comparing circuit.

Figure 9:
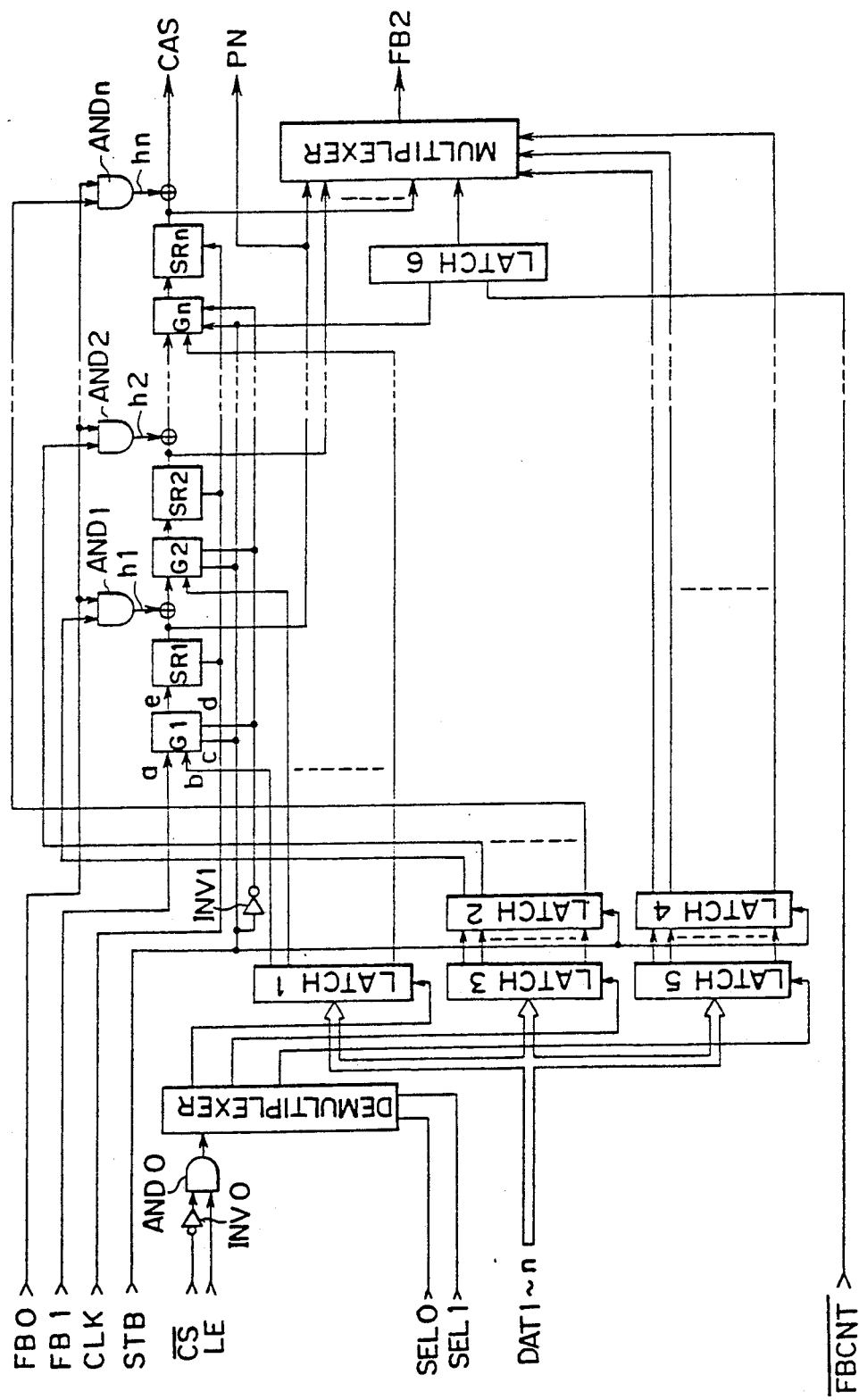
FIG. 9 is a block diagram showing an example of the PNG used in the embodiments described above.

In the case where e.g. a maximum length linearly recurring sequence (hereinbelow called simply m sequence) code is used for the PN code, an m sequence code generator as indicated in FIG. 9 is used. In FIG. 9, LATCH 1 to LATCH 6 are latch circuits; MPX is a multiplexer; DE-MPX is a demultiplexer; $AND_0$ to $AND_n$ are AND gates; $SR_1$ to $SR_n$ is flipflops constituting a shift register; $G_1$ to $G_n$ are steering gates for setting the initial value of the shift register; and $INV_0$ and $INV_1$ are inverters.

As initial information necessary for the generation of the code in the PNG, as indicated in FIG. 9, there are the following information sets (i) to (iii);

(i) The initial state of the shift register, (ii) The feedback state, and (iii) The last stage selection state for the shift register.

In FIG. 9, CLK represents a code clock; STB a code switching strobe; CS a chip select; LE a latch enable; DAT 1~n data (i)~(iii); and SEL 0~1 data selects, which select the data, e.g. as indicated in Table 1. Further, FB0~2 and CAS are the input and the output terminals for the cascade connection, respectively; FB2 is a three state output; and PN represents the code output.

TABLE 1

| SEL 1 | SEL 0 | DATA |
|---|---|---|
| L | L | (i) |
| L | H | (ii) |

TABLE 1-continued

| SEL 1 | SEL 0 | DATA |
|-------|-------|------|
| H | L | (iii) |
| H | H | Meaningless |

The PNG indicated in FIG. 9 generates the m sequence code by the code switching strobe STB on the basis of the data (i) to (iii).

Figure 2:
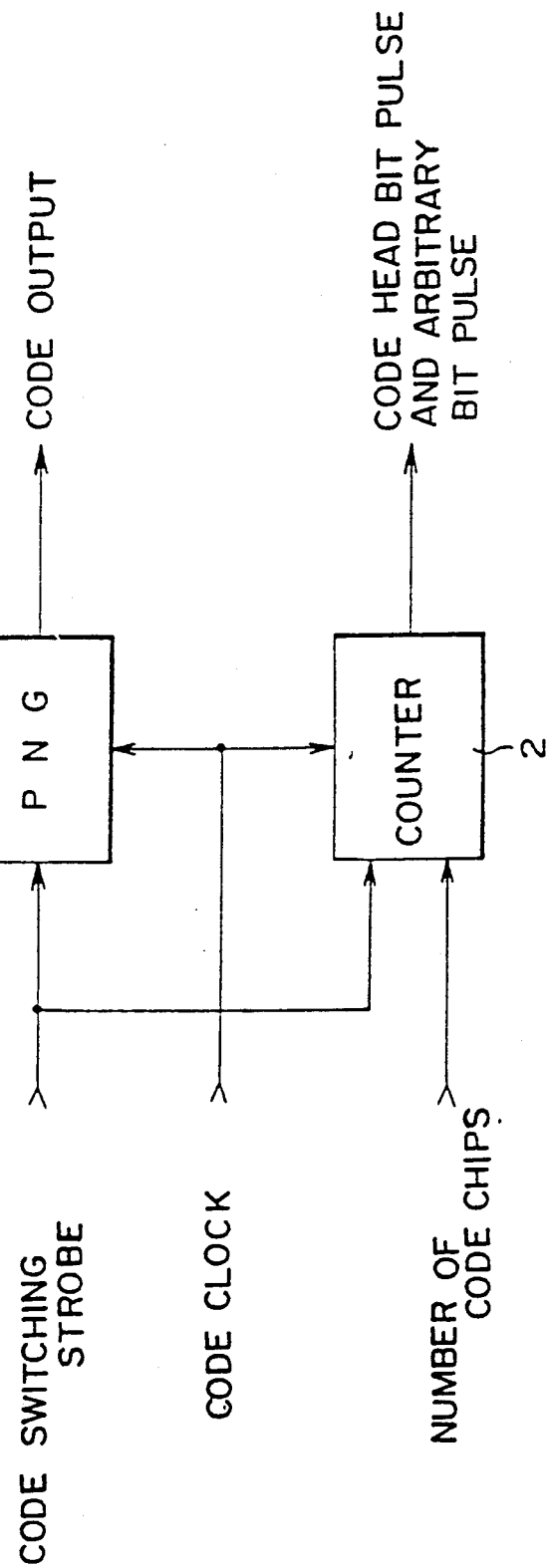
FIG. 2 is a block diagram showing a prior art circuit generating the head bit pulse of the PN code.

It is known that, in general, $$1 \sim 2^2-1$$

values in the content of the n stage shift register of the PNG 1 generating the m sequence code undergo transitions at random in one period of the m sequence code. Consequently the comparing circuit 12 in FIG. 1 compares the output of the latch circuit 11, in which the data (i) is set, with the transition value of the shift register outputted by the PNG 10 and outputs a code bit pulse, every time they are in accordance with each other. It can generates also an arbitrary bit pulse by changing the value set in the latch circuit 11. The transition value of the shift register described above concerning FIGS. 1 and 2 corresponds to the parallel data of the shift register $SR_1 \sim SR_n$ inputted in the multiplexer MPX on the left side in the PNG in FIG. 9.

FIG. 6A shows the relation in the point of time among the correlation pulse generated from the correlation spike outputted by a correlator such as an SAW convolver, etc., the sampling pulse and the code head bit pulse, in the case where the code synchronization is effected.

Figure 3:
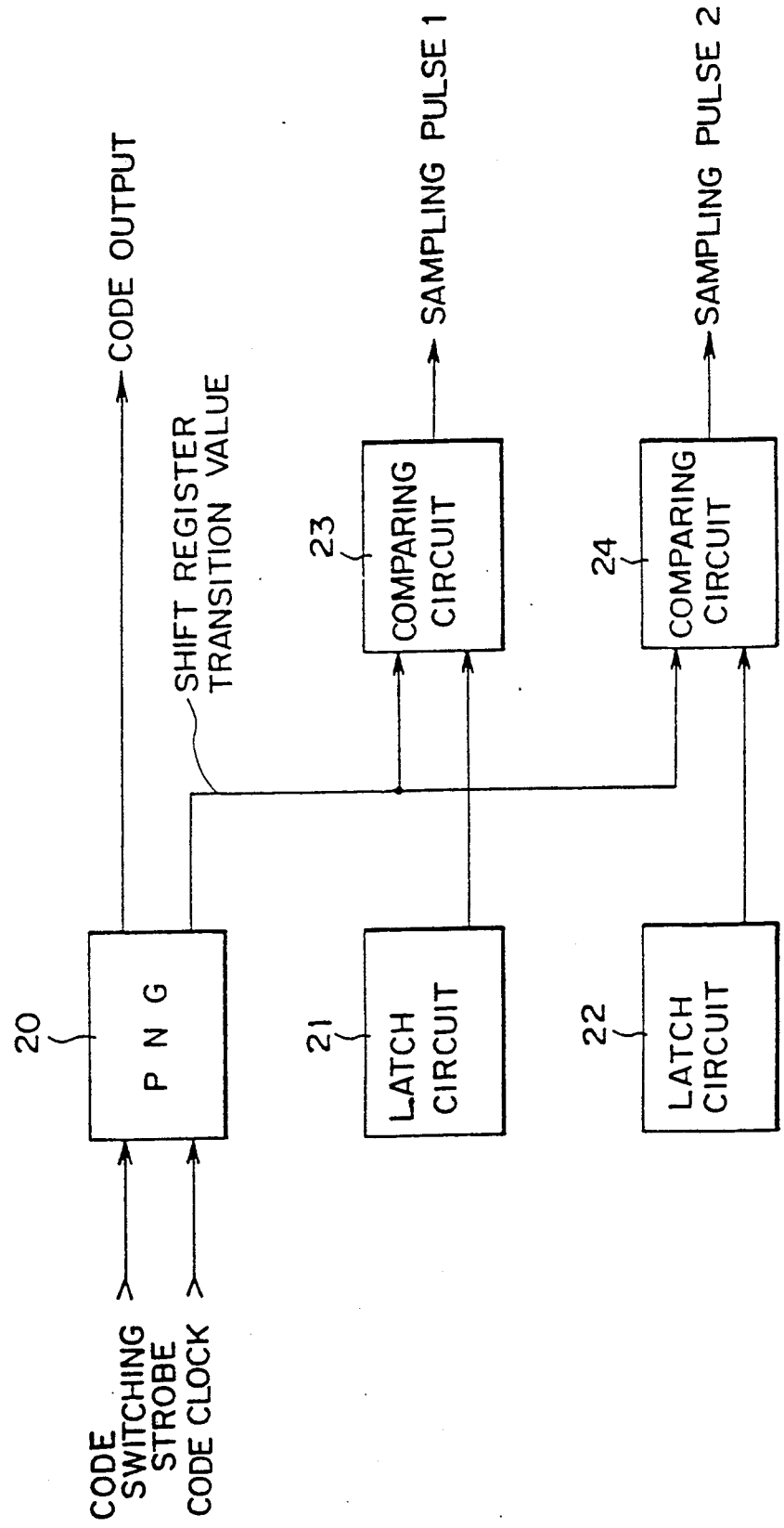
FIG. 3 is a block diagram showing an embodiment of the second invention.
Figure 4:
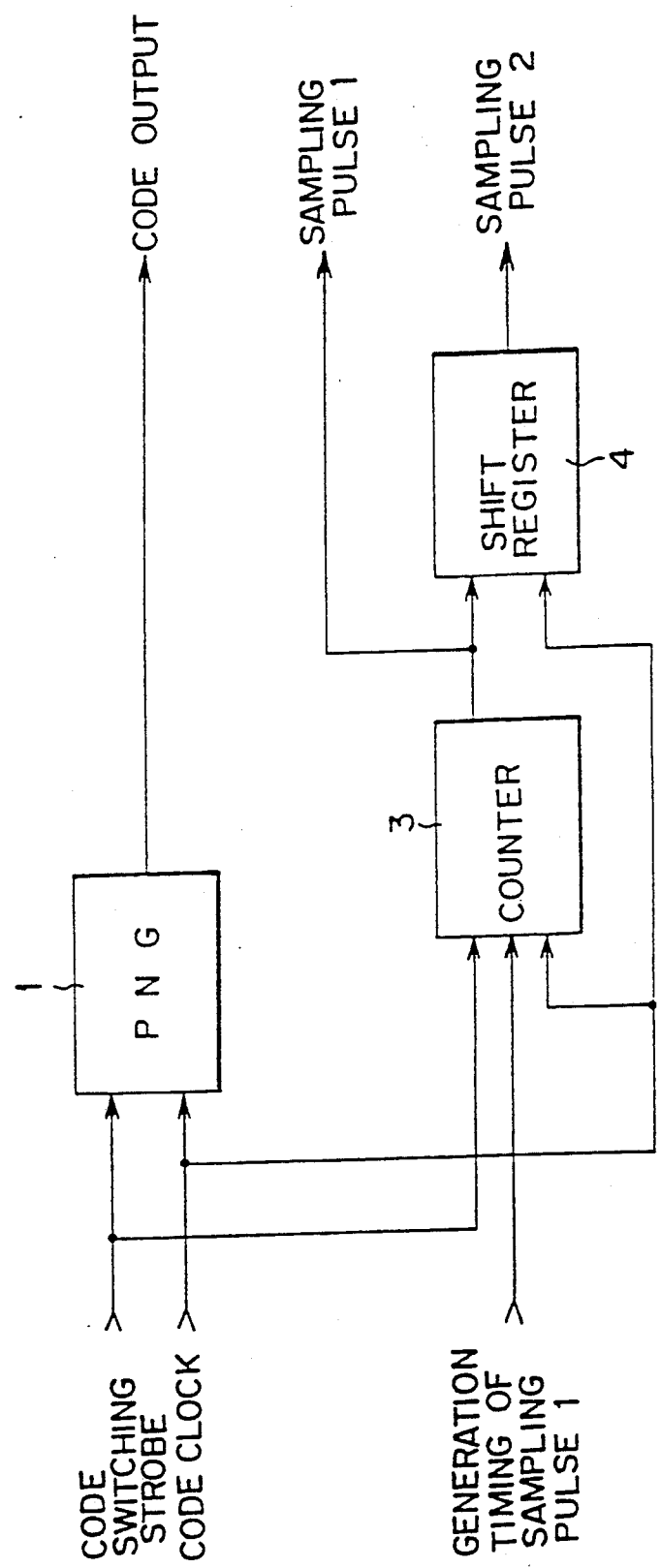
FIG. 4 is a block diagram showing a prior art sampling pulse generating circuit.

Next FIG. 3 shows an embodiment of the sampling pulse generating circuit according to the second invention, in which reference numeral 20 is a PNG; 21 and 22 are latch circuits; and 23 and 24 are comparing circuits. Supposing that the PNG indicated in FIG. 9 is used similarly to the preceding embodiment, the m sequence code is generated by the code switching strobe STB on the basis of the data (i)~(iii).

$$1 \sim 2^n-1$$

values in the content of the n stage shift register of the PNG in FIG. 9 undergo transitions at random in one period of the m sequence code, as described previously.

In order to fulfil the relation in the point of time of the sampling pulse 1 with respect to the code head bit pulse indicated in FIG. 6A, the shift register value of the PNG 20 obtained on the basis of the data (i) is latched in the latch circuit 21. Further, in order to fulfil the relation in the point of time of the sampling pulse 2 with respect to the sampling pulse 1 indicated in FIG. 6A, the shift register value of the PNG 20 obtained on the basis of the date (i) is latched in the latch circuit 23.

Consequently the comparing circuit 23 and 24 compare the outputs from latch circuits 21 and 22 with the transition value of the shift register outputted by the PNG 20 and output the sampling pulses 1 and 2, respectively, every time they are in accordance with each other.

Figure 7:
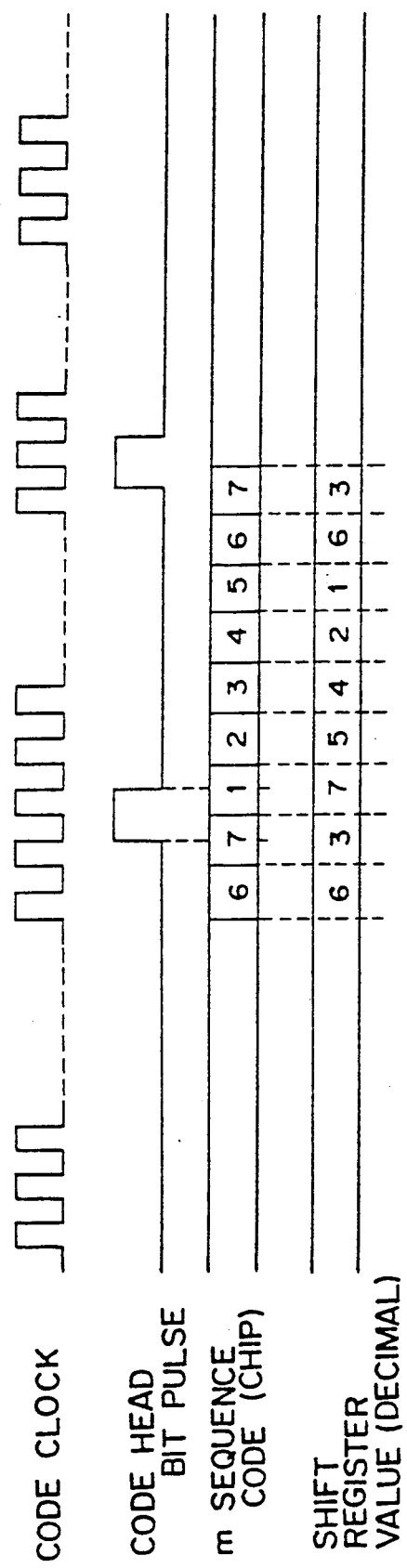
FIG. 7 indicates an example of the state transition of the shift register in the PNG.

FIG. 7 shows an example of the state transition of the shift register of the PNG 20 generating an m sequence code having a code length 7, indicating the code head bit pulse and shift register values corresponding to different chips.

Figure 8:
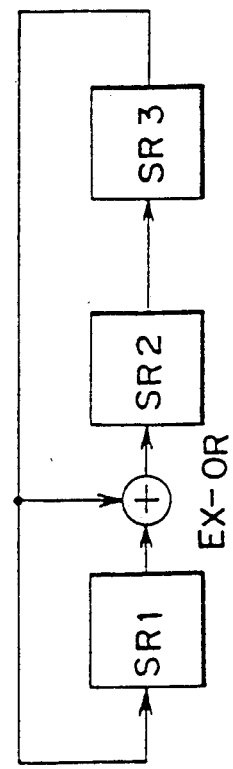
FIG. 8 is a scheme showing an example of the construction of a 3-stage shift register.

FIG. 8 is a scheme showing the construction of the PNG generating the m sequence code having the code length 7 indicated in FIG. 7, in which EX-OR represents an exclusive logic sum gate. The following table shows the transition of different shift register values in one period of the m sequence code.

| m sequence code (chip) | $SR_1$ | $SR_2$ | $SR_3$ | |
|---|---|---|---|---|
| 1 | 1 | 1 | 1 | 7 |
| 2 | 1 | 0 | 1 | 5 |
| 3 | 1 | 0 | 0 | 4 |
| 4 | 0 | 1 | 0 | 2 |
| 5 | 0 | 0 | 1 | 1 |
| 6 | 1 | 1 | 0 | 6 |
| 7 | 0 | 1 | 1 | 3 |
| | BINARY REPRESENTATION | | | DECIMAL REPRESENTATION |

In reality, there exists a delay time T3, when the correlation pulse is generated from the correlation spike, as indicated in FIG. 6B. However this can be easily solved by varying the values latched by the latch circuits 21 and 22.

Figure 5:
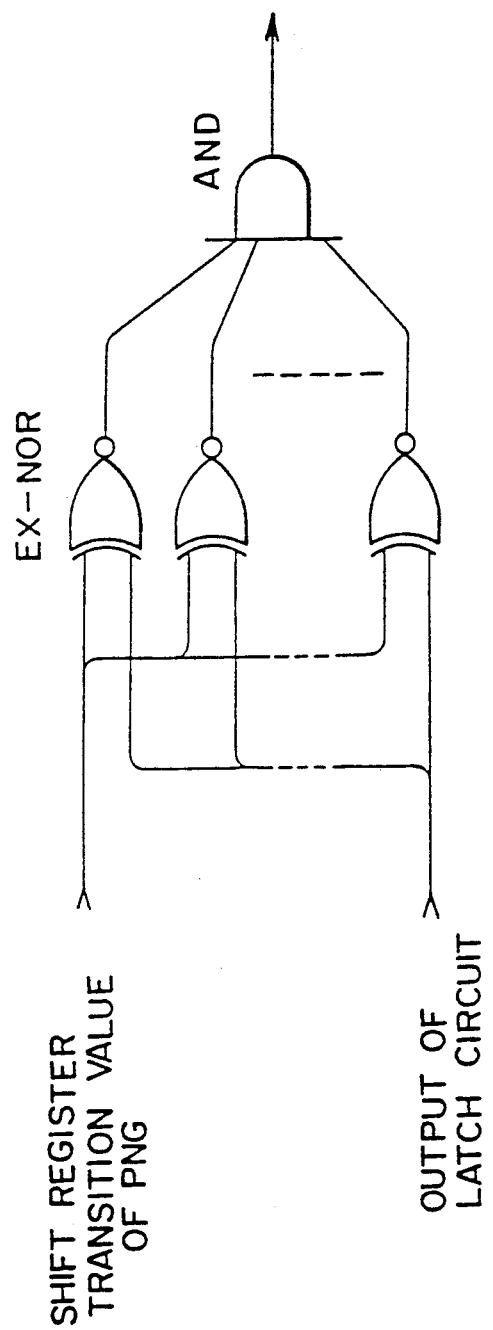
FIG. 5 indicates an example of the construction of the comparing circuit used in the embodiments described above.

Each of the comparing circuits 12, 23 and 24 in FIGS. 1 and 3 can be composed of a circuit indicated e.g. in FIG. 5. In the same figure, it is obtained by the EX-NOR (exclusive NOR) gates whether the outputs of the latch circuits and the shift register values of the PNG are in accordance or disaccordance with each other. When the accordance is obtained for all the EX-NOR gates, the AND gate outputs "1" as the code head bit pulse.

As explained above, according to the first invention, the code head bit pulse and the arbitrary bit pulse useful for the code synchronization can be easily generated without using any high speed counter.

According to the second invention, the sampling pulse useful for the code synchronization can be easily generated without using any high speed counter or shift register.

What is claimed is:

1. A circuit comprising:
   a pseudonoise code generator having a shift register which outputs a sequence of values; and
   a bit pulse generating circuit which includes: a latch circuit which latches a shift register value periodically appearing in said sequence of values output by said shift register of said pseudonoise code generator at respective points in time when a bit pulse is to be generated; and a comparing circuit which is coupled to said latch circuit and to said shift register, which compares each value of said sequence of values output by said shift register of said pseudonoise code generator with said shift register value in said latch circuit and which outputs a bit pulse only when the value currently output by said shift register equals said shift register value in said latch circuit.

2. A circuit according to claim 1, wherein said shift register has a plurality of outputs and said latch circuit has a plurality of outputs, wherein said comparing circuit includes a plurality of exclusive NOR gates each having an output and having two inputs respectively coupled to a respective said output of said shift register and a respective said output of said latch circuit, and an AND gate having an output which carries said bit pulse and having a plurality of inputs each coupled to the output of a respective one of said exclusive NOR gates.

3. A circuit comprising:
   a pseudonoise code generator having a shift register which outputs a sequence of values; and
   a sampling pulse generating circuit which includes: a latch circuit which latches a shift register value periodically appearing in said sequence of values output by said shift register of said pseudonoise code generator at respective points in time when a sampling pulse is to be generated; and a comparing circuit which is coupled to said latch circuit and to said shift register, which compares each value of said sequence of values output by said shift register of said pseudonoise code generator with said shift register value in said latch circuit and which outputs a sampling pulse only when the value currently output by said shift register equals said shift register value in said latch circuit.

4. A circuit according to claim 3, wherein said latch circuit includes a first latch which latches said shift register value and a second latch which latches a further value periodically appearing in said sequence and different from said shift register value in said first latch, and
   wherein said comparing circuit includes a first comparing circuit which is coupled to said shift register and said first latch and outputs said sampling pulse, and a second comparing circuit which is coupled to said second latch and to said shift register, which compares each value of said sequence of values with said further value in said second latch, and which outputs a further pulse when the value currently produced by said shift register equals said further value in said second latch.

5. A circuit according to claim 3, wherein said shift register has a plurality of outputs and said latch circuit has a plurality of outputs, wherein said comparing circuit includes a plurality of exclusive NOR gates each having an output and having two inputs respectively coupled to a respective said output of said shift register and a respective said output of said latch circuit, and an AND gate having an output which carriers said sampling pulse and having a plurality of inputs each coupled to the output of a respective one of said exclusive NOR gates.

* * * * *